(12) United States Patent
Yoshida et al.

(10) Patent No.: US 10,998,170 B2
(45) Date of Patent: May 4, 2021

(54) METHOD FOR ION MASS SEPARATION AND ION ENERGY CONTROL IN PROCESS PLASMAS

(71) Applicants: Tokyo Electron Limited, Tokyo (JP); MKS Instruments, Inc., Andover, MA (US)

(72) Inventors: Yusuke Yoshida, Albany, NY (US); Sergey Voronin, Albany, NY (US); Alok Ranjan, Austin, TX (US); David J. Coumou, Rochester, NY (US); Scott E. White, Rochester, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/377,522

(22) Filed: Apr. 8, 2019

(65) Prior Publication Data
US 2019/0318916 A1    Oct. 17, 2019

Related U.S. Application Data

(60) Provisional application No. 62/657,272, filed on Apr. 13, 2018.

(51) Int. Cl.
*H01J 37/32*    (2006.01)

(52) U.S. Cl.
CPC .. *H01J 37/32422* (2013.01); *H01J 37/32082* (2013.01); *H01J 2237/0815* (2013.01); *H01J 2237/3341* (2013.01)

(58) Field of Classification Search
CPC .......... H01J 37/32422; H01J 37/32082; H01L 21/0228
See application file for complete search history.

(56) References Cited

U.S. PATENT DOCUMENTS

| 4,207,137 A | 6/1980 | Tretola |
| 10,395,895 B2 | 8/2019 | Coumou et al. |
| 2011/0248634 A1 | 10/2011 | Heil et al. |
| 2011/0309049 A1 | 12/2011 | Papasouliotis et al. |

(Continued)

OTHER PUBLICATIONS

Korean Intellectual Property Office, The International Search Report and the Written Opinion for International application No. PCT/US2019/026261, dated Jul. 29, 2019, 14 pg.

(Continued)

*Primary Examiner* — Binh X Tran

(57) ABSTRACT

Plasma ion energy distribution for ions having different masses is controlled by controlling the relationship between a base RF frequency and a harmonic RF frequency. By the controlling the RF power frequencies, characteristics of the plasma process may be changed based on ion mass. The ions that dominate etching may be selectively based upon whether an ion is lighter or heavier than other ions. Similarly, atomic layer etch processes may be controlled such that the process may be switched between a layer modification step and a layer etch step though adjustment of the RF frequencies. Such switching is capable of being performed within the same gas phase of the plasma process. The control of the RF power includes controlling the phase difference and/or amplitude ratios between a base RF frequency and a harmonic frequency based upon the detection of one or more electrical characteristics within the plasma apparatus.

18 Claims, 13 Drawing Sheets

(56) References Cited

U.S. PATENT DOCUMENTS

| | | | |
|---|---|---|---|
| 2012/0217221 A1 | 8/2012 | Hoffman et al. | |
| 2012/0273341 A1* | 11/2012 | Agarwal | H01J 37/32165 |
| | | | 204/164 |
| 2014/0055034 A1 | 2/2014 | Coumou | |
| 2014/0097908 A1 | 4/2014 | Fisk, II et al. | |
| 2014/0320013 A1 | 10/2014 | Coumou et al. | |
| 2016/0064231 A1* | 3/2016 | Agarwal | B81C 1/00531 |
| | | | 438/712 |
| 2017/0062186 A1* | 3/2017 | Coumou | H01J 37/32165 |
| 2018/0174860 A1* | 6/2018 | Kanarik | H01L 21/6831 |

OTHER PUBLICATIONS

The International Bureau of WIPO, The International Preliminary Report on Patentability for International application No. PCT/US2019/026261, dated Oct. 22, 2020, 9 pg.

* cited by examiner

METHOD FOR ION MASS SEPARATION AND ION ENERGY CONTROL IN PROCESS PLASMAS

This application is related to U.S. Patent Application No. 62/657,272, filed on Apr. 13, 2018, entitled "Method for Ion Mass Separation and Ion Energy Control in Process Plasmas," by Yoshida, et al., the disclosure of which is expressly incorporated by reference in its entirety.

BACKGROUND

The present disclosure relates to the processing of substrates in plasma process equipment. In particular, it provides an apparatus and method to control plasmas generated in plasma processing apparatus.

The use of plasma systems for the processing of substrates has long been known. For example, plasma processing of semiconductor wafers is well known. The plasma systems may be typically utilized for a plasma etching process and/or plasma deposition process. Plasma processing presents numerous technical challenges and as geometries for structures and layers on substrates continue to shrink, control of the plasma becomes increasingly important. In general, plasmas are generated by supplying high frequency electrical power to gas mixtures in a chamber that separate the plasma from surrounding environment. Performance of plasma processes is impacted by a number of factors variables including species, density, and kinetic energy of ions, reactive neutrals, etc.

In order to achieve desired process performance, variable settings of the plasma processing equipment can be adjusted to change the plasma properties. These settings include, but are not limited to gas flow rates, gas pressure, electrical power for the plasma excitation, bias voltages, etc., all as is known in the art. One of the challenges to achieve desired performance is controllability of the plasma properties. Since the variable settings are not directly related to the plasma properties, there are limitations for the control. As the requirements of substrate processing are becoming more and more challenging, better controllability of the plasma properties is needed.

SUMMARY

In one exemplary embodiment, described herein are innovative plasma processing methods and system that utilize control of ion energy in the plasma by using multiple harmonic frequency components for plasma excitation. More particularly, relative amplitude and/or phase shift between the different frequency components is controlled so as to provide desired ion energy plasma properties. The relative amplitude and/or phase shift may be controlled without direct and/or manual ion energy measurements. Rather, the ion energy within the plasma may be dynamically controlled by monitoring one or more electrical characteristics within the plasma apparatus, such as for example, impedance levels, electrical signals in the radio frequency (RF) generator, electrical signals in a the matching networks, and electrical signals in other circuits of the plasma processing apparatus. Thus, as direct measurement of ion energy is not usually available in plasma equipment for the mass production of substrates, a technique to provide fast and accurate control of ion energy distribution in plasma process systems is provided. The monitoring and control of the ion energy may be accomplished dynamically during the plasma process so as to maintain a desired ion energy distribution. Thus the techniques described herein may advantageously provide, for example, in-situ ion energy optimization in multiple harmonic frequency systems without an ion energy sensor and may provide, for example, dynamic control capability which keeps optimal operating conditions for ion energy distribution during the process. Other advantages will be recognized having the benefit of the disclosure provided herein.

In one embodiment, plasma processing system capable of plasma processing a substrate is provided. The system may comprise a process chamber and one or more RF sources, the one or more RF sources coupled to the process chamber and configured to provide RF power to the process chamber through at least a base frequency voltage at a base frequency and a second frequency voltage at a second frequency, the second frequency being a second harmonic frequency or higher harmonic of the base frequency. The system may further comprise control circuitry, the control circuitry coupled to at least one other component of the plasma processing system to receive at least one electrical characteristic of the plasma processing system during plasma processing of the substrate. The system also comprises at least one output of the control circuitry coupled to the at least one of the one or more RF sources, the one or more RF sources configured to adjust a characteristic of the base frequency voltage and/or the second frequency voltage so as to be capable of obtaining a desired ion energy distribution during plasma processing of the substrate.

In another embodiment, a method for plasma processing a substrate is provided. The method may comprise providing a process chamber and coupling one or more RF sources to the process chamber to provide RF power to the process chamber through at least a base frequency voltage at a base frequency and a second voltage at a second frequency, the second frequency being a second harmonic frequency or higher harmonic of the base frequency. The method also comprises monitoring at least one electrical characteristic of a plasma processing system during plasma processing of the substrate. The method further comprises adjusting, during the plasma processing, a phase difference between the base frequency voltage and the second frequency voltage and/or an amplitude ratio of the base frequency voltage and the second frequency voltage so as to obtain a desired ion energy distribution during plasma processing of the substrate.

In yet another embodiment, a method for processing a substrate is provided. The method may comprise providing a process chamber and coupling one or more RF sources to the process chamber to provide RF power to the process chamber through at least a base frequency voltage at a base frequency and a second voltage at a second frequency, the second frequency being a second harmonic frequency or higher harmonic of the base frequency. The method also comprises coupling a matching network between the process chamber and the one or more RF sources. The method further comprises monitoring at least an impedance of the process chamber as seen by the matching network during plasma processing of the substrate. The method also comprises adjusting, during the plasma processing, at least a phase difference between the base frequency voltage and the second frequency voltage so as to obtain a desired ion energy distribution during plasma processing of the substrate.

In another exemplary embodiment, described herein are techniques for controlling the ion energy distribution in a plasma in which the ion energy distribution of ions having different masses is simultaneously controlled by controlling the application of the applied RF power, specifically the relationship between a base RF frequency and a harmonic frequency. Thus, the techniques allow for ion energy control over ions having different masses. By the controlling the RF power distribution between two frequencies, characteristics of the plasma process may be changed. For example, the ions that dominate etching may be selectively based upon whether an ion is lighter or heavier than other ions. Similarly, atomic layer etch processes may be controlled such that the process may switch between a layer modification step and a layer etch step though adjustment of the RF frequencies. Such switching is capable of being performed within the same gas phase of the plasma process. Thus, a common gas phase of the plasma may be used for both the layer modification step and the layer etch step while adjustment of the RF source is used to place the system in the layer modification step or the layer etch step. In one embodiment, the control of the RF power includes controlling the phase difference and/or amplitude ratios between a base RF frequency and a harmonic frequency. Further, the control of the phase difference and/or amplitude ratios may rely upon the detection of one or more electrical characteristics within the plasma apparatus, such as for example, impedance levels, electrical signals in the radio frequency (RF) generator, electrical signals in the matching networks, and electrical signals in other circuits of the plasma processing apparatus.

In one embodiment, a method for plasma processing a substrate is provided. The method may comprise providing a process chamber and coupling one or more RF sources to the process chamber to provide RF power to the process chamber through at least a base frequency voltage at a base frequency and a second frequency voltage at a second frequency, the second frequency being a second harmonic frequency or higher harmonic of the base frequency. The method further comprises providing at least a first type of ion and a second type of ion in the process chamber, the first type of ion having a first mass and the second type of ion having a second mass, the first mass and the second mass being differing masses. The method also comprises controlling an ion energy distribution of the first type of ion and the second type of ion by adjusting a relationship between the base frequency voltage and the second frequency voltage so as to allow selective control of the ion energy distribution based upon the first mass and the second mass.

In another embodiment, a method for plasma etching a substrate is provided. The method may comprise providing a process chamber and coupling one or more RF sources to the process chamber to provide RF power to the process chamber through at least a base frequency voltage at a base frequency and a second frequency voltage at a second frequency, the second frequency being a second harmonic frequency or higher of the base frequency. The method further comprises providing at least a first type of ion and a second type of ion in the process chamber, the first type of ion having a first mass and the second type of ion having a second mass, the first mass and the second mass being differing masses. The method also comprises controlling an ion energy distribution of the first type of ion and the second type of ion by adjusting a relationship between the base frequency voltage and the second frequency voltage so as to allow selective control of the ion energy distribution based upon the first mass and the second mass. The controlling the ion energy distribution allows for selectively controlling an etch impact of at least one of the first type of ion and the second type of ion.

In yet another embodiment, a method for plasma etching a substrate is provided. The method may comprise providing a process chamber and coupling one or more RF sources to the process chamber to provide RF power to the process chamber through at least a base frequency voltage at a base frequency and a second frequency voltage at a second frequency, the second frequency being a second harmonic frequency or higher of the base frequency. The method further includes providing at least a first type of ion and a second type of ion in the process chamber, the first type of ion having a first mass and the second type of ion having a second mass, the first mass being heavier than the second mass. The method further comprises controlling an ion energy distribution of the first type of ion and the second type of ion by adjusting a phase difference between the base frequency voltage and the second frequency voltage and/or an amplitude ratio of the base frequency voltage and the second frequency voltage. The controlling the ion energy distribution generates an asymmetrical ion energy distribution of at least one of the first type of ion or the second type of ion, and the asymmetrical ion energy distribution is used to adjust an etch impact of the second type of ion relative to the first type of ion.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
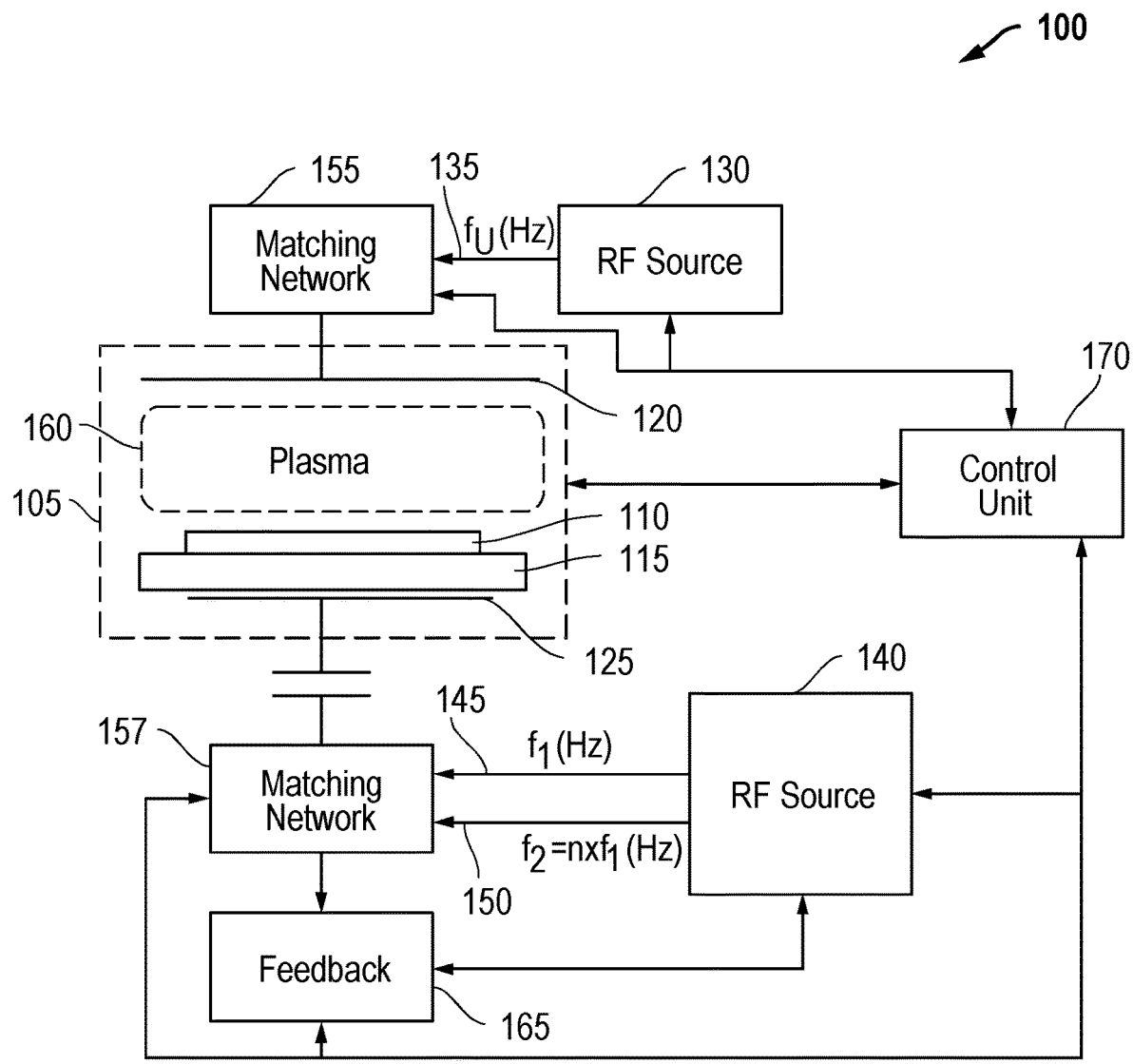
FIG. 1 illustrates an exemplary plasma processing system for implementing the plasma processing techniques described herein.

It has been found that improved plasma processing results may be obtained through control of an application of base frequency RF power and RF power of a harmonic frequency of the base frequency. In one exemplary embodiment, described herein are innovative plasma processing methods that utilize control of ion energy in the plasma by using multiple harmonic frequency components for plasma excitation. More particularly, relative amplitude and/or phase shift between the different frequency components is controlled so as to provide desired ion energy plasma properties. The relative amplitude and/or phase shift may be controlled without direct and/or manual ion energy measurements. Rather, the ion energy within the plasma may be dynamically controlled by monitoring one or more electrical characteristics of a plasma processing system, such as for example, impedance levels, electrical signals in the radio frequency (RF) generator, electrical signals in a the matching networks, and/or electrical signals in other circuits of the plasma processing apparatus. Thus, as direct measurement of ion energy is not usually available in plasma equipment for the mass production of substrates, a technique to provide fast and accurate control of ion energy distribution in plasma process systems is provided. The monitoring and control of the ion energy may be accomplished dynamically during the plasma process so as to maintain a desired ion energy distribution. Thus the techniques described herein may advantageously provide, for example, in-situ ion energy optimization in multiple harmonic frequency systems without an ion energy sensor and may provide, for example, dynamic control capability which keeps optimal operating conditions for ion energy distribution during process. Other advantages will be recognized having the benefit of the disclosure provided herein.

In another exemplary embodiment, described herein are techniques for controlling the ion energy distribution in a plasma in which the ion energy distribution of ions having different masses is simultaneously controlled by controlling the application of the applied RF power, specifically the relationship between a base RF frequency and a harmonic frequency. Thus, the techniques allow for ion energy control over ions having different masses. By the controlling the RF power frequencies, characteristics of the plasma process may be changed. For example, the ions that dominate etching may be selectively based upon whether an ion is lighter or heavier than other ions. Similarly, atomic layer etch processes may be controlled such that the process may be switched between a layer modification step and a layer etch step though adjustment of the RF frequencies. Such switching is capable of being performed within the same gas phase of the plasma process. In one embodiment, the control of the RF power includes controlling the phase difference and/or amplitude ratios between a base RF frequency and a harmonic frequency. Further, the control of the phase difference and/or amplitude ratios may rely upon the detection of one or more electrical characteristics within the plasma apparatus, such as for example, impedance levels, electrical signals in the radio frequency (RF) generator, electrical signals in a the matching networks, and electrical signals in other circuits of the plasma processing apparatus.

The techniques described herein may be utilized with a wide range of plasma processing systems. For example, the techniques may be utilized with plasma etch process systems, plasma deposition process systems or any other plasma process system. FIG. 1 illustrates one exemplary plasma processing system 100 merely for illustrative purposes. It will be recognized that other plasma process systems may equally implement the concepts described herein. For example, the plasma processing system 100 may be a capacitively coupled plasma processing apparatus, inductively coupled plasma processing apparatus, microwave plasma processing apparatus, radial line slot antenna (RLSA) microwave plasma processing apparatus, electron cyclotron resonance (ECR) plasma processing apparatus, etc. Thus, it will be recognized by those skilled in the art that the techniques described herein may be utilized with any of a wide variety of plasma processing systems. The plasma processing system 100 can be used for a wide variety of operations including, but not limited to, etching, deposition, cleaning, plasma polymerization, plasma-enhanced chemical vapor deposition (PECVD), atomic layer deposition (ALD) and so forth. The structure of a plasma processing system 100 is well known, and the particular structure provided herein is merely exemplary.

As shown in the exemplary system of FIG. 1, a plasma processing system 100 may include a process chamber 105. As is known in the art, process chamber 105 may be a pressure controlled chamber. A substrate 110 (in one example a semiconductor wafer) may be held on a stage or chuck 115. An upper electrode 120 and a lower electrode 125 may be provided as shown. The upper electrode 120 may be electrically coupled to an upper RF source 130 through an upper matching network 155. The upper RF source 130 may provide an upper frequency voltage 135 at an upper frequency $f_U$. The lower electrode 125 may be electrically coupled to a lower RF source 140 through a lower matching network 157. The lower RF source 140 may provide a plurality of lower frequency voltages. For example, a first lower frequency voltage 145 may be provided at a first lower frequency $f_1$ and a second lower frequency voltage 150 may be provided at a second lower frequency $f_2$. As discussed in more detail below, the second lower frequency $f_2$ may be a second harmonic or higher harmonic of the first lower frequency $f_1$. Thus, $f_2$ may equal $n \times f_1$, wherein n is an integer greater than 1. Thus, the first lower frequency voltage 145 may operate as a base frequency voltage and the second lower frequency voltage 150 may operate as a second voltage at a second frequency, the second frequency being a second harmonic or higher harmonic of the base frequency.

A feedback circuit 165 may be provided. As shown, the feedback circuit 165 provides feedback between the lower matching network 157 and the lower RF source 140. Specifically in the example shown, the feedback circuit 165 receives an input from the lower matching network 157 and provides an output which is coupled to the lower RF source 140. It will be recognized that such use of feedback is merely exemplary, and as discussed below feedback may be provided to the lower RF source 140 from any of a wide range of other components of the plasma processing system 100 as the use of feedback to control the amplitude and phase shift of harmonic frequencies, as discussed below, is not limited to feedback from the lower matching network 157. It will be recognized by those skilled in the art that many other components (not shown) may be included in the plasma processing system 100 or the components shown may be excluded depending upon the type of plasma processing system 100 is utilized.

Components of the plasma processing system 100 can be connected to, and controlled by, a control unit 170 which in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. It will be recognized that since control unit 170 may be coupled to various components of the plasma processing system 100 to receive inputs from and provide outputs to, in one embodiment the functionality of feedback circuit 165 may be incorporated directly within the control unit 170, without the need for an additional feedback circuit 165.

The control unit 170 can be implemented in a wide variety of manners. For example, the control unit 170 may be a computer. In another example, the control unit may be comprised off one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented. The feedback circuit 165 may be comprised of circuitry similar to that found in the control unit. Alternatively, the feedback circuit 165 may be specific circuitry designed to accomplish the specific feedback control of the RF source by being designed to provide an input to the RF source based upon measurements of a specific electrical characteristic monitored in the plasma processing system 100 so as to provide control of the phase shifts and amplitude ratios found at the outputs of the lower RF source 140.

In operation, the plasma processing apparatus uses the upper and lower electrodes to generate a plasma 160 in the process chamber 105 when applying power to the system from the upper RF source 130 and the lower RF source 140. Further, as is known in the art, ions generated in the plasma 160 may be attracted to the substrate 110. The generated plasma can be used for processing a target substrate (such as substrate 110 or any material to be processed) in various types of treatments such as, but not limited to, plasma etching, chemical vapor deposition, treatment of semiconductor material, glass material and large panels such as thin-film solar cells, other photovoltaic cells, and organic/inorganic plates for flat panel displays, etc.

Application of power results in a high-frequency electric field being generated between the upper electrode 120 and the lower electrode 125. Processing gas delivered to process chamber 105 can then be dissociated and converted into a plasma. As shown in FIG. 1, the exemplary system described utilizes both upper and lower RF sources. For example high-frequency electric power, for an exemplary capacitvely coupled plasma system, in a range from about 3 MHz to 150 MHz may be applied from the upper RF source 130 and a low frequency electric power in a range from about 0.2 MHz to 40 MHz can be applied from the lower RF source. It will be recognized that the techniques described herein may be utilized with in a variety of other plasma systems. In one example system the sources may switched (higher frequencies at the lower electrode and lower frequencies at the upper electrode). Further, a dual source system is shown merely as an example system and it will be recognized that the techniques described herein may be utilized with other systems in which a frequency power source is only provided to one electrode, direct current (DC) bias sources are utilized, or other system components are utilized, etc.

As noted in FIG. 1, lower RF source 140 provides both a first lower frequency voltage and a second lower frequency voltage at a first frequency $f_1$ and a harmonic frequency $f_2$, respectively. It will be recognized that lower RF source 140 may be considered as a single RF source providing two or more frequencies, or alternatively, the lower RF source 140 may be considered to be a system having a plurality of RF sources which each provide an RF voltage. Thus, lower RF source 140 may be comprised of one or more RF sources. Further, as discussed above, the use of the sources as the upper and lower sources may be swapped, and thus the use of harmonics is not limited to just application to the lower electrode, but may also be utilized for application to the upper electrode.

Figure 2:
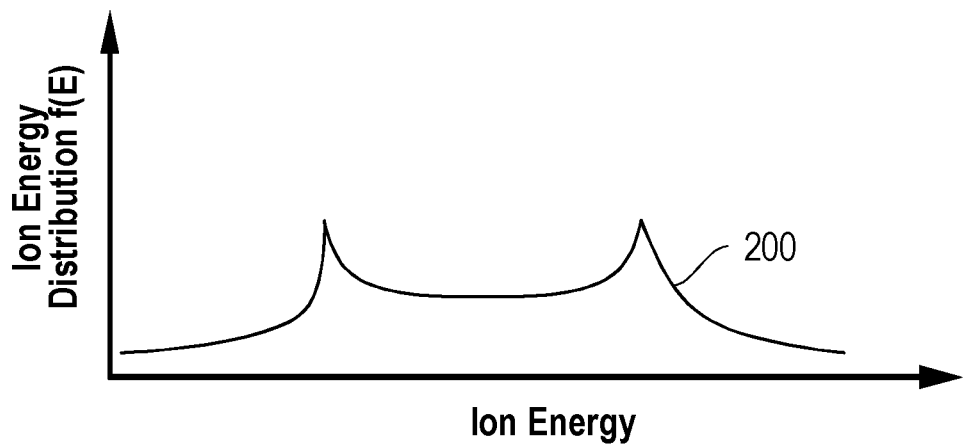
FIG. 2 illustrates a prior art bimodal ion energy distribution plot for plasma processing.
Figure 3:
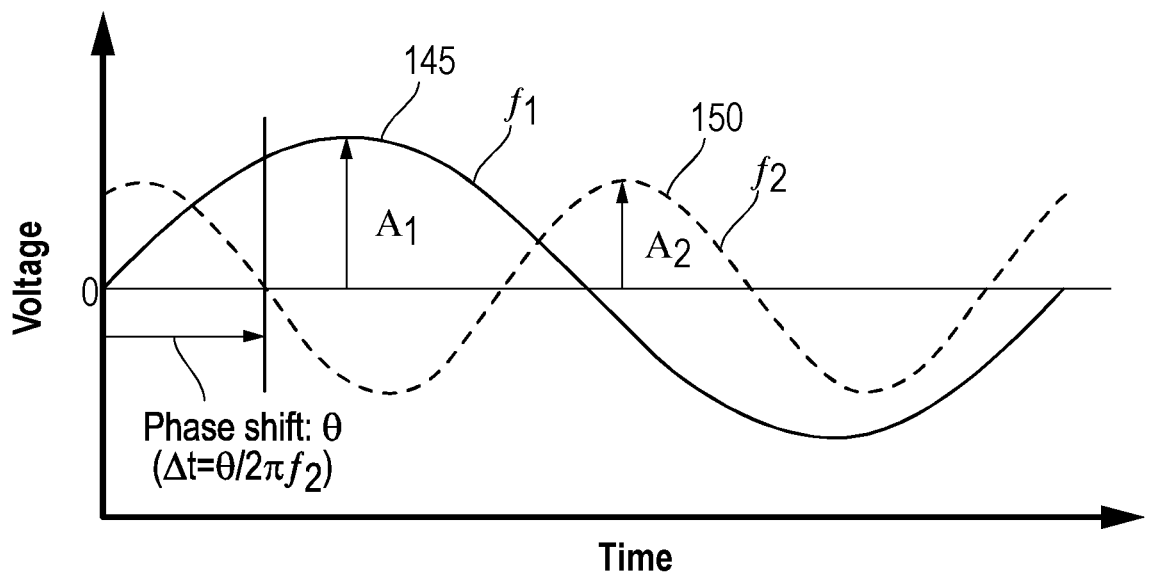
FIG. 3 illustrates phase shift and amplitude differences between a base frequency power source and a harmonic frequency power source.

It is known in the art that conventional ion energy distributions in plasma systems often take the form of a bimodal ion energy distribution. For example, FIG. 2 illustrates a conventional bimodal ion energy distribution plot 200 that may occur in a plasma etch system. Further, it is known It is known in the art, for example as shown in U. Czarnetzki et al, Plasma Sources Sci. Technol., vol. 20, no. 2, p. 024010, that ion energy distribution in a plasma may be controlled through the application of harmonic frequencies in the power sources. More specifically, control of the amplitude ratios and relative phase shift between the different harmonic frequencies can impact the ion energy distribution. Thus, for example, in a plasma processing system 100 such as shown in FIG. 1, the first lower frequency voltage 145 and the second lower frequency voltage 150 may be controlled to provide desired amplitude ratios and relative phase shift between the frequencies so as to impact the ion energy distribution. FIG. 3 illustrates exemplary amplitudes $A_1$ and $A_2$ of the first lower frequency voltage 145 and the second lower frequency voltage 150. FIG. 3 also illustrates an exemplary phase shift θ between the first lower frequency voltage 145 and the second lower frequency voltage 150.

Figure 4:
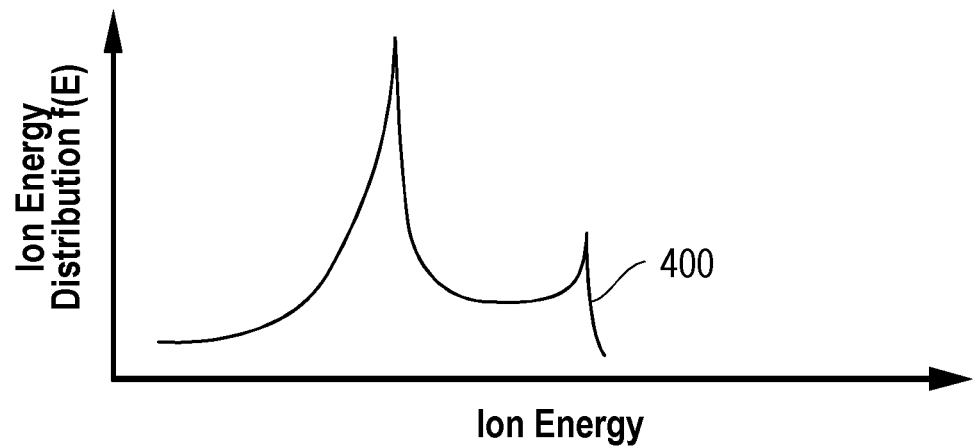
FIG. 4 illustrates an exemplary ion energy distribution plot that may result from the use of a harmonic frequency power source in addition to a base frequency power source.
Figure 5:
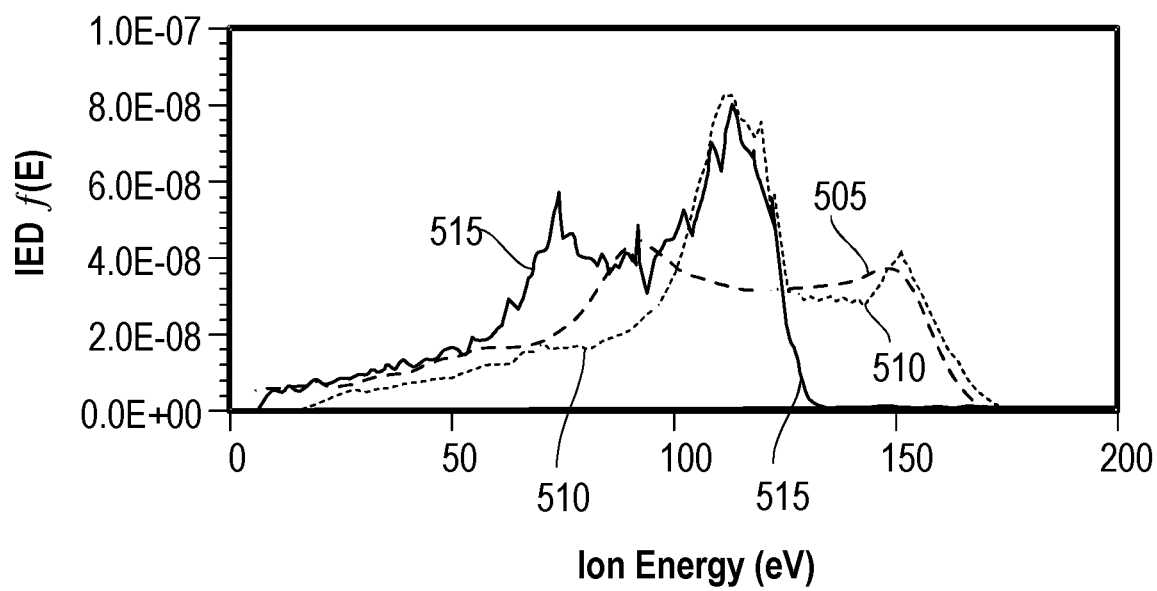
FIG. 5 illustrates exemplary ion energy distribution plots without the use of a harmonic frequency power source and with the use of a harmonic frequency power source at differing phase shifts.

Thus, for example as shown in FIG. 4, a conventional bimodal ion energy distribution (such as shown in FIG. 2) may be changed through the use and control of a harmonic frequency to yield plot 400. As shown in FIG. 4, an ion energy distribution has been adjusted via control of the amplitude ratios and relative phase shift. FIG. 5 illustrates three exemplary ion energy distributions. Plot 505 indicates an ion energy distribution for the use of a single lower frequency RF source (for example 13.5 MHz). Plot 510 indicates the impact of using a second (harmonic) frequency RF source in addition to the 13.5 MHz RF source. Plot 510 indicates the ion energy distribution that results when the two sources have a 0 degree phase shift. Plot 515 also indicates the impact of using a second (harmonic) frequency RF source in addition to the 13.5 MHz RF source, however in this case the phase shift is 180 degrees. As can be seen from the figure, the use of harmonics and varying the phase shift can impact the ion energy distribution. As shown in the figures, the ion energy distribution is graphed as ion energy distribution units f(E) which are the number of ions of particular energy arriving per time unit on a surface area unit.

Figure 6:
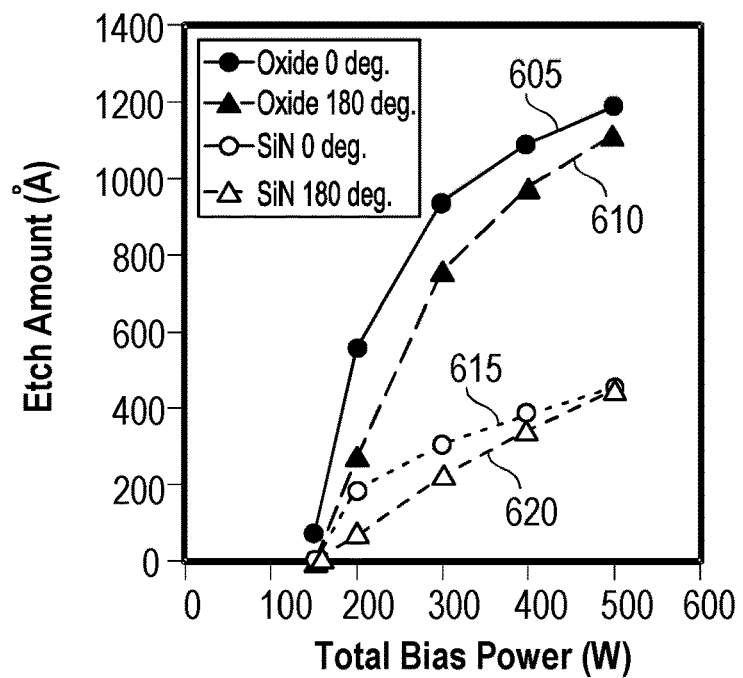
FIG. 6 illustrates the impact of differing phase shifts of a harmonic frequency power source on silicon oxide and silicon nitride etch amounts as a function of bias power.
Figure 7:
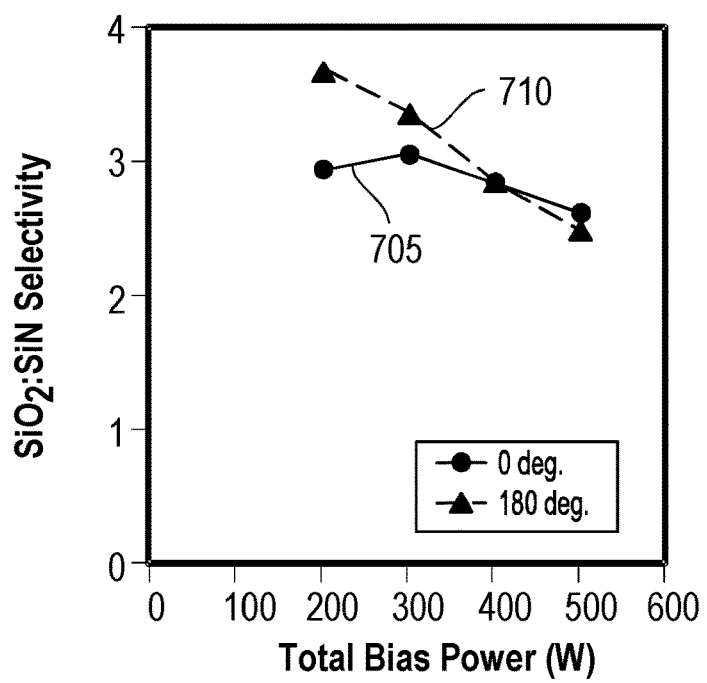
FIG. 7 illustrates the impact of differing phase shifts of a harmonic frequency power source on the etch selectivity between silicon oxide and silicon nitride etch amounts as a function of bias power.

Depending upon the particular plasma process, the change in ion energy distribution may result in corresponding changes in etch, deposition, etc. characteristics of the plasma process. FIGS. 6 and 7 illustrate exemplary changes. In FIGS. 6 and 7 the total bias power is the sum of the power of both the base frequency and the harmonic frequency. In the examples shown, each frequency provides 50% of the power. Thus, for example, a 400 W total bias power may be provided by 200 W at 13.56 MHz and 200 W at 27.12 MHz. It will be recognized the particular percentage distribution of the power and the particular frequencies chosen are merely exemplary and the techniques disclosed herein are not limited to such examples. As shown in FIG. 6 etch amounts are graphed versus total bias power. More specifically, oxide and silicon nitride etch rates are shown when using an additional harmonic frequency at a 0 degree shift and at a 180 degree shift with respect to the base frequency. Thus, plot 605 illustrates silicon oxide etch amounts at a 0 degree shift and plot 610 illustrates silicon oxide etch amounts at a 180 degree shift. Similarly, plot 615 illustrates silicon nitride etch amounts at a 0 degree shift and plot 620 illustrates silicon nitride etch amounts at a 180 degree shift. The resulting selectivity between silicon oxide and silicon nitride for the phase shifts is shown in FIG. 7, with plot 705 being the selectivity at a 0 degree phase shift and plot 710 being the selectivity at a 180 degree phase shift. It will be recognized that FIGS. 5-7 are merely exemplary and the use of harmonic control of an RF source in a plasma processing system may be utilized in a wide range of plasma processes.

It has been found that it would be desirable to control such ion energy distributions in-situ in real-time so as to better control the characteristics of the plasma process. More specifically, optimal operating conditions such as phase shift and/or amplitude ratios for the multiple frequencies utilized with the plasma process may change as operating conditions or plasma conditions change. However, as mentioned, direct measurement of ion energy distribution is not generally available in commercial high volume manufacturing plasma equipment. As described herein, the optimal phase shift and/or amplitude ratio may be selected by monitoring other system characteristics and providing feedback to the plasma processing system so that the ion energy distribution may be adjusted in real-time in response to monitoring those other system characteristics.

The other system characteristics that are monitored may be any of a wide range of characteristics. In one example, with reference to FIG. 1, the impedance of the process chamber as seen by the lower matching network 157 may be monitored by the feedback circuit 165 and/or the control unit 170. The detected impedance conditions may then be utilized to by the feedback circuit 165 and/or the control unit 170 to provide an input to the lower RF source 140 so as to adjust the relative amplitude ratio and phase shift between the first lower frequency voltage 145 and the second lower frequency voltage 150. Thus control circuitry (either feedback circuitry or a control unit) may be used to provide the desired adjustments. In this manner, during plasma processing the lower RF source 140 may be adjusted in-situ so as to achieve the desired ion energy distribution shape during plasma processing. Though described with regard to the impedance seen by the matching network, it will be recognized that other electrical signals may also be monitored. For example, electrical signals within the matching network may be monitored, DC bias voltages may be monitored, various voltage levels in the RF source may be monitored, the voltage and current level of various voltages and currents within the system may be monitored (for example, the ac peak to peak voltage (Vpp) levels or voltages and current phase shifts relative to each other), etc.

In one embodiment, the amplitude ratio and relative phase shift may be scanned within a specific range, and electrical signals (such as for example but not limited to impedance) of the plasma processing system 100 are collected. Depending on desired shape of ion energy distribution, the plasma processing system 100 may then calculate optimal amplitude ratio and relative phase shift between multiple frequencies based on the collected data and a model for correlation between ion energy distribution and the electrical signals. The model can be either theoretical, experimental, or combination of the two. Thus, it will be recognized that a correlation of the electrical signal monitored and the achieved ion energy distribution obtained may come from the formation of correlation tables or graphs obtained from experimental use, theoretical calculations or a combination of the same. Likewise, theoretical and/or experimental statistical correlations may be obtained. Similarly, simulated and/or experimental functions or models for the correlation may be obtained. Thus, it will be recognized that in a wide range of manners a correlation may be obtained between one or more characteristics of the system (for example an electrical characteristic) and the resulting ion energy distribution for such characteristics. In this way, real-time changes may be made to the lower RF source 140 so as to achieve the desired ion energy distribution, for example, by adjusting the amplitude ratio and/or phase shift in real-time in response to system electrical measurements (for example, in one embodiment, the process chamber impedance).

In this manner, a system may be provided that allows for in-situ ion energy optimization in multiple harmonic frequency systems without the requirement of the use of an ion energy sensor during manufacturing processing. Further, the dynamic control capability may allow for maintaining a desired ion energy distribution at a desired shape even while operating conditions (for example pressure, source power, process chemistry, etc.) may act to change that shape during processing. Though the examples described above have been made with regard to one base frequency voltage (first lower frequency voltage 145) and one harmonic frequency voltage (second lower frequency voltage 150), it will be recognized that the concepts described herein may be utilized with the use of one base frequency voltage and two or more harmonic frequency voltages.

Figure 8:
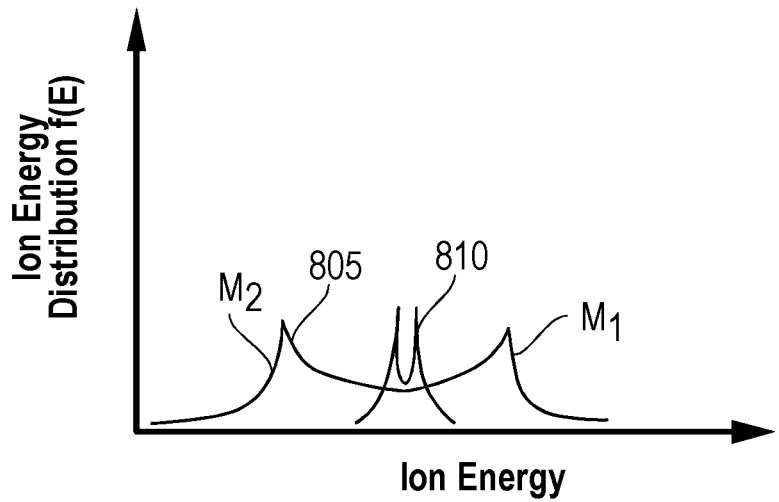
FIG. 8 illustrates a typical symmetrical bimodal ion energy distribution plot for plasma processing having ions of differing masses.
Figure 9:
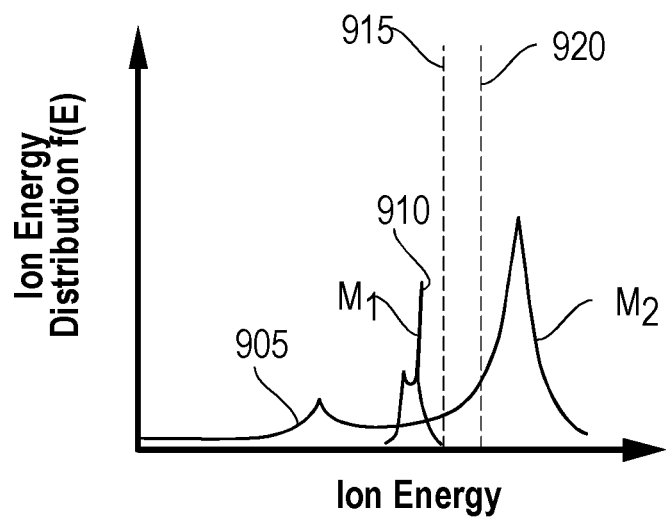
FIG. 9 illustrates an asymmetrical ion energy distribution plot with the inclusion of an etch thresholds for plasma processing having ions of differing masses when utilizing harmonic frequency techniques described herein.
Figure 10:
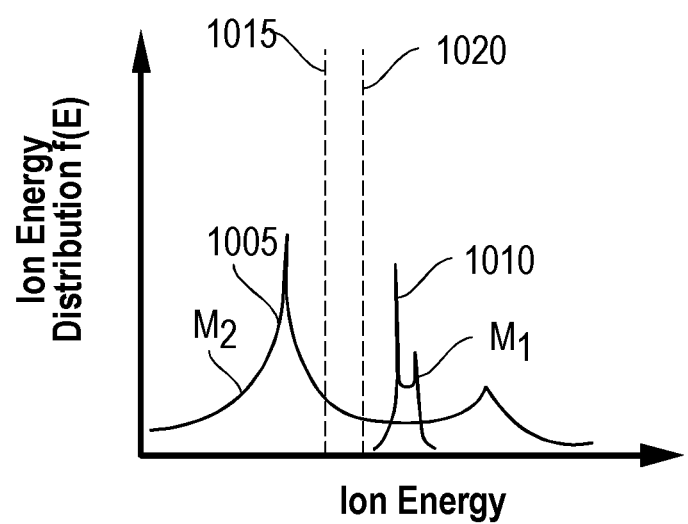
FIG. 10 illustrates another asymmetrical ion energy distribution plot with the inclusion of an etch thresholds for plasma processing having ions of differing masses when utilizing harmonic frequency techniques described herein.

The ability to control the ion energy distribution may be particularly useful in plasma processes which utilize multiple ions of differing masses. FIG. 8 illustrates a conventional bimodal ion energy distribution that may occur in a plasma etch system having two differing ions of differing masses. For example, plot 805 indicates a plot of the ion energy distribution for ions $M_2$ and plot 810 indicates an ion energy distribution for ions $M_1$, where the mass of ions $M_1$ is greater than the mass of ions $M_2$. As discussed above, the use of RF harmonic frequencies and control of the phase shift and amplitude ratio may be used to adjust the conventional bimodal ion energy distributions so as accentuate or enhance one of the peaks of the ion energy distribution. For example, the control of the harmonic frequency may provide an ion energy distribution of the ions $M_1$ and $M_2$ such that the light ions $M_2$ have higher energy than compared to the heavy ions $M_1$. Thus, as seen in FIG. 9, plot 905 indicates the ion energy distribution of the light ions $M_2$ and plot 910 indicates the ion energy distribution of the heavy ions $M_1$. In FIG. 9 it can be seen that the light ions $M_2$ have higher energy than the heavy ions $M_1$. FIG. 9 includes an exemplary etch threshold 915 which is the threshold above which the energy of ions $M_1$ needs to be to conduct etching action and also includes an etch threshold 920 above which the energy of ions $M_2$ needs to be to conduct etching action. It will be recognized that the etch thresholds will depend upon the particular plasma chemistry and conditions utilized. Similarly, the control of the harmonic frequency may provide an ion energy distribution of the ions $M_1$ and $M_2$ such that the light ions $M_2$ have lower energy than compared to the heavy ions $M_1$. Thus, as seen in FIG. 10, plot 1005 indicates the ion energy distribution of the light ions $M_2$ and plot 1010 indicates the ion energy distribution of the heavy ions $M_1$. In FIG. 10 it can be seen that the light ions $M_2$ have lower energy than the heavy ions $M_1$. FIG. 10 includes an exemplary etch threshold 1015 which is the threshold above which the energy of ions $M_1$ needs to be to conduct etching action and also includes an etch threshold 1020 above which the energy of ions $M_2$ needs to be to conduct etching action. It will be recognized that the etch thresholds will depend upon the particular plasma chemistry and conditions utilized. Thus as shown in the figures, the ion energy distribution of processes with two differing ions having different masses may exhibit at least two peaks for each ion and the techniques described herein may enhance at least one peak of an ion, for example, the first peak or the second peak of the ion so as to change the performance characteristics of the plasma process.

Thus, as shown in the figures, asymmetric ion energy distributions may be obtained. Such asymmetry may be advantageously utilized in a plasma processes which utilize two or more ions of differing masses. For example, in a plasma etch process having lighter ions $M_2$ and heavier ions $M_1$ and the etch thresholds of FIG. 9, an asymmetric ion energy distribution such as seen in FIG. 9 will result in dominate etching by lighter ions $M_2$. Conversely, an asymmetric ion energy distribution and the etch thresholds such as seen in FIG. 10 will result in dominate etching by heavier ions $M_1$. One exemplary plasma etch process may be a chlorine ($Cl_2$)/helium (He) based etch. In such, case, lighter ions, $He^+$, may perform the dominant removal mechanism in conditions of FIG. 9 while heavier ions, $Cl_2^+$ or $Cl^+$, may perform the dominant removal mechanism in the conditions of FIG. 10. Thus, as shown in FIGS. 9 and 10, the ion energy distribution peak for an ion may be asymmetrically enhanced at one peak or the other in a manner that will impact the processing characteristics of the plasma. In this manner, control of ion energy distribution may be utilized to impact the processing characteristics (for example but not limited to an etch characteristic) of the plasma process utilized. Further, as discussed above, control of the phase shift and amplitude ratio of a harmonic frequency may be utilized to achieve such variations in the ion energy distribution as seen in FIGS. 9 and 10. Real-time in-situ control of the phase shift and amplitude may further be based upon electrical characteristics of the plasma processing system as discussed above.

In this manner, selective etching by particular ion species may be controlled in-situ in a plasma processing system based upon applying phase shifts and/or amplitude ratio adjustments between a harmonic frequency and a base frequency at which power is provided to a plasma process chamber. Further, feedback from monitored electrical characteristics of the plasma process system may be utilized to control the phase shifts and/or amplitude ratio adjustments.

The techniques described above for utilizing and controlling ions of differing masses may be particularly useful in atomic layer etch (ALE) processes. ALE processes are general known to involve processes which remove thin layers sequentially through one or more self-limiting reactions. Such processes often include a cyclic series of layer modification and etch steps. The modification step may modify the exposed surfaces and the etch step may remove the modified layer. Thus, a series of self-limiting reactions may occur. As used herein, an ALE process may include quasi-ALE processes. In such processes, a series of modification and etch step cycles may still be used, however, the removal step may not be purely self-limiting as after removal of the modified layer, the etch substantially slows down, though it may not completely stop. In either case, the ALE based processes include a cyclic series of modification and etch steps.

Figure 11A:
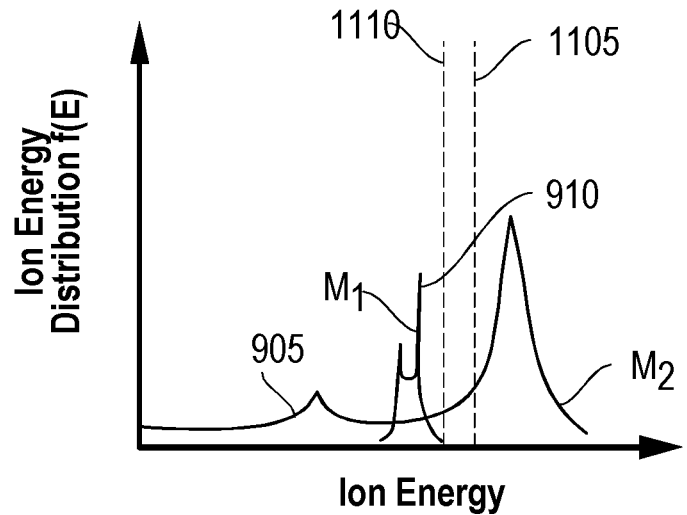
FIGS. 11A and 11B illustrate the asymmetrical ion energy distribution plot of FIGS. 9 and 10 with the inclusion of different etch thresholds for use in an atomic layer etch process.
Figure 11B:
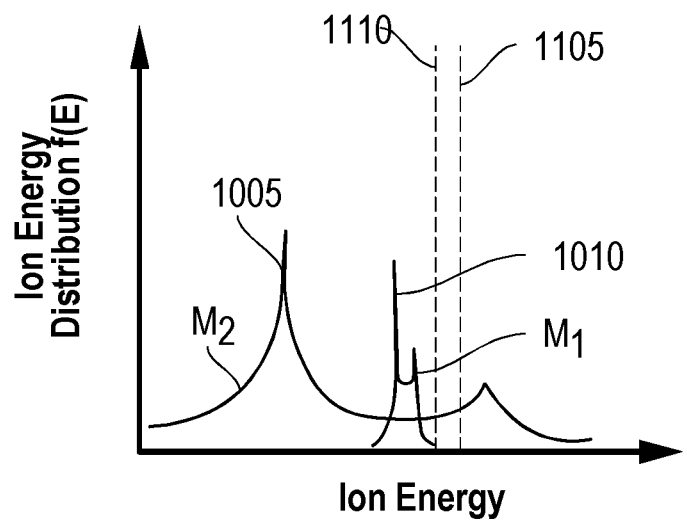
Figure 12A:
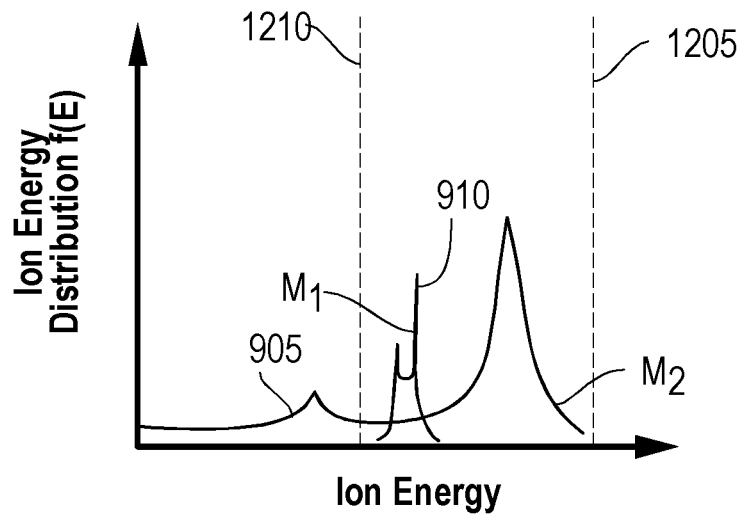
FIGS. 12A and 12B illustrate the asymmetrical ion energy distribution plot of FIGS. 9 and 10 with the inclusion of different etch thresholds for use in another atomic etch layer process.
Figure 12B:
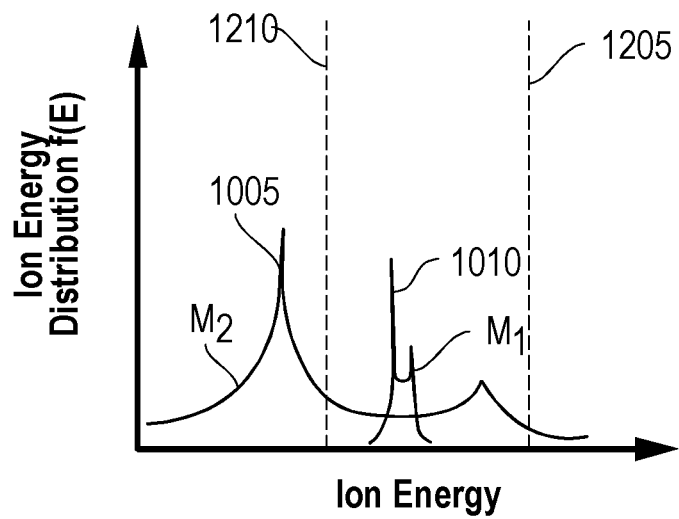

The use of the techniques described herein may be utilized in an atomic layer etch process to selectively change the plasma processing between a layer modification step and an etching step. In one exemplary process, the atomic layer etching process may utilize heavier ions $M_1$ for the layer modification process and lighter ions $M_2$ for the layer removal process. For example for use with silicon surfaces, ions $M_1$ may be $Cl_2^+$ or $Cl^+$ for silicon surface modification and ions $M_2$ may be inert gas ions or noble gas ions such as, for example, He. Alternatively, depending upon the materials and ions involved, a process may use the heavier ions $M_1$ for the layer removal process and lighter ions $M_2$ for the layer modification process. In another embodiment, for use with a silicon antireflective coating surface, $H^+$ ions can be used for silicon antireflective coating surface modification at high energy, while F chemistry can be used for its selective removal. In yet another example, an $C_4F_8$/He plasma may be utilized. In such case, a CF film may be formed on the surface when He ions are at a low energy and the CF film may be removed by He ions driven to a high energy. In the $C_4F_8$/He plasma example, without changing the ion energy distribution shape, high bias voltages would be needed and surface damage and/or etching by CF energetic ions would occur. FIGS. 11A and 11B correspond to the $M_1$ and $M_2$ ion energy distributions of FIGS. 9 and 10 except with the addition of different etch thresholds 1105 and 1110 as indicated. Etch threshold 1105 illustrates the ion energy threshold above which ions $M_2$ will provide etching action and below which the ions $M_2$ will not provide etching action. Etch threshold 1110 illustrates the ion energy threshold above which ions $M_1$ will provide etching action and below which the ions $M_1$ will not provide etching action. If such energies for ions are below a threshold at which etching occurs, than etching would substantially not occur and the layer modification processes of ions $M_1$ would dominate. Thus, the ion energy distribution as shown in FIG. 11A would primarily provide the etching ions (the lighter ions $M_2$) at higher ion energies above the etching threshold to provide the etching or removal action of the atomic layer etch process. The ion energy distribution as shown in FIG. 11B would primarily provide the etching ions (the lighter ions $M_2$) at lower ion energies below the etching threshold so that the process would be dominated by the modification processes of heavier ions $M_1$ or radicals in the plasma. FIGS. 12A and 12B illustrate yet another atomic layer etch process. In this process surface modification may be accomplished by the lighter ions $M_2$ and etching or removal of the modified surface is performed by the heavier ions $M_1$ or radicals in the plasma. As shown in FIG. 12A, an etch threshold 1205 is provided, below which the lighter ions $M_2$ do not participate in etching or removal. An etch threshold 1210 indicates the etch threshold above which the heavier ions $M_1$ etch or remove the modified surface.

The use of a base power frequency and harmonic power frequencies may be controlled so as to alternate the atomic layer etch process between the states of FIGS. 11A and 11B and between 12A and 12B. In this manner, the modification and etching/removal steps may be segregated and alternated by use of control of the relationship of the base and harmonic frequencies. Further, such control may be utilized within the same gas phase of the plasma. It will be recognized that control of the frequencies may be obtained in-situ as discussed above by controlling phase shifts and amplitude ratios of the various frequencies. Further, such control of the phase shifts and amplitude ratios may be based upon electrical characteristics of the plasma processing system, such as described in more detail above. Thus, by control of the RF sources, an ion energy distribution selectively controls a layer modification step or a layer etch step of the atomic layer etch process In this manner, simultaneous control over ion energy for ions of differing masses may be obtained. Further, the control may be implemented in a manner that allows for selective energy modulation of targeted ion masses such that the control may be used to implement fast processing of atomic layer etching. Such atomic layer etching control may even be achieved within the gas phase of the plasma process.

It will be recognized that the applications described above are merely exemplary, and many other processes and applications may advantageously utilize the techniques disclosed herein. FIGS. 13-17 illustrate exemplary methods for use of the plasma processing techniques described herein. It will be recognized that the embodiments of FIGS. 13-17 are merely exemplary and additional methods may utilized the techniques described herein. Further, additional processing steps may be added to the methods shown in the FIGS. 13-17 as the steps described are not intended to be exclusive. Moreover, the order of the steps is not limited to the order shown in the figures as different orders may occur and/or various steps may be performed in combination or at the same time.

Figure 13:
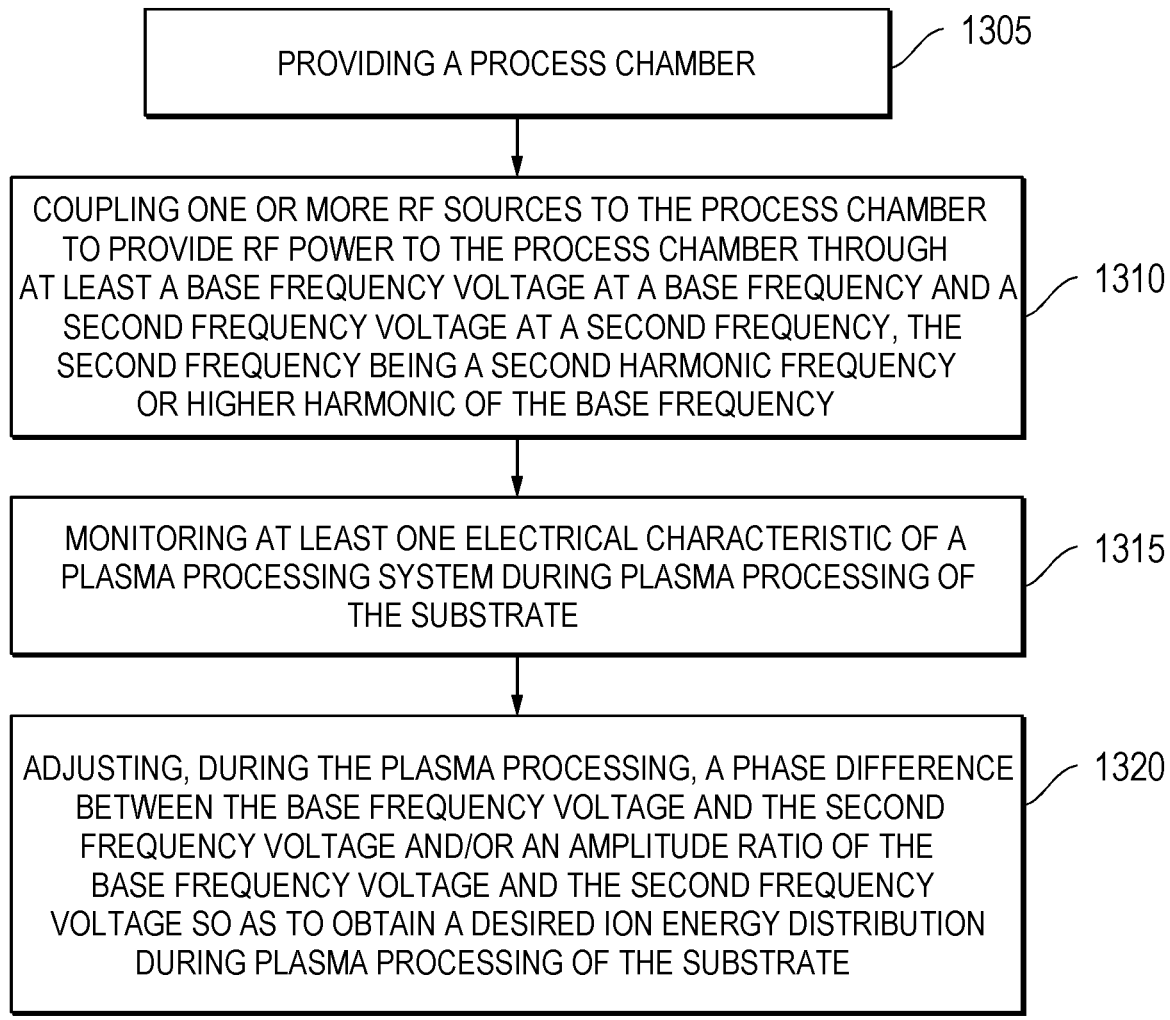
FIGS. 13-17 illustrate exemplary methods for use of the plasma processing techniques described herein.

As shown in FIG. 13, a method for plasma processing a substrate is provided. Step 1305 includes providing a process chamber. Step 1310 includes coupling one or more RF sources to the process chamber to provide RF power to the process chamber through at least a base frequency voltage at a base frequency and a second frequency voltage at a second frequency, the second frequency being a second harmonic frequency or higher harmonic of the base frequency. Step 1315 includes monitoring at least one electrical characteristic of a plasma processing system during plasma processing of the substrate. Step 1320 includes adjusting, during the plasma processing, a phase difference between the base frequency voltage and the second frequency voltage and/or an amplitude ratio of the base frequency voltage and the second frequency voltage so as to obtain a desired ion energy distribution during plasma processing of the substrate.

Figure 14:
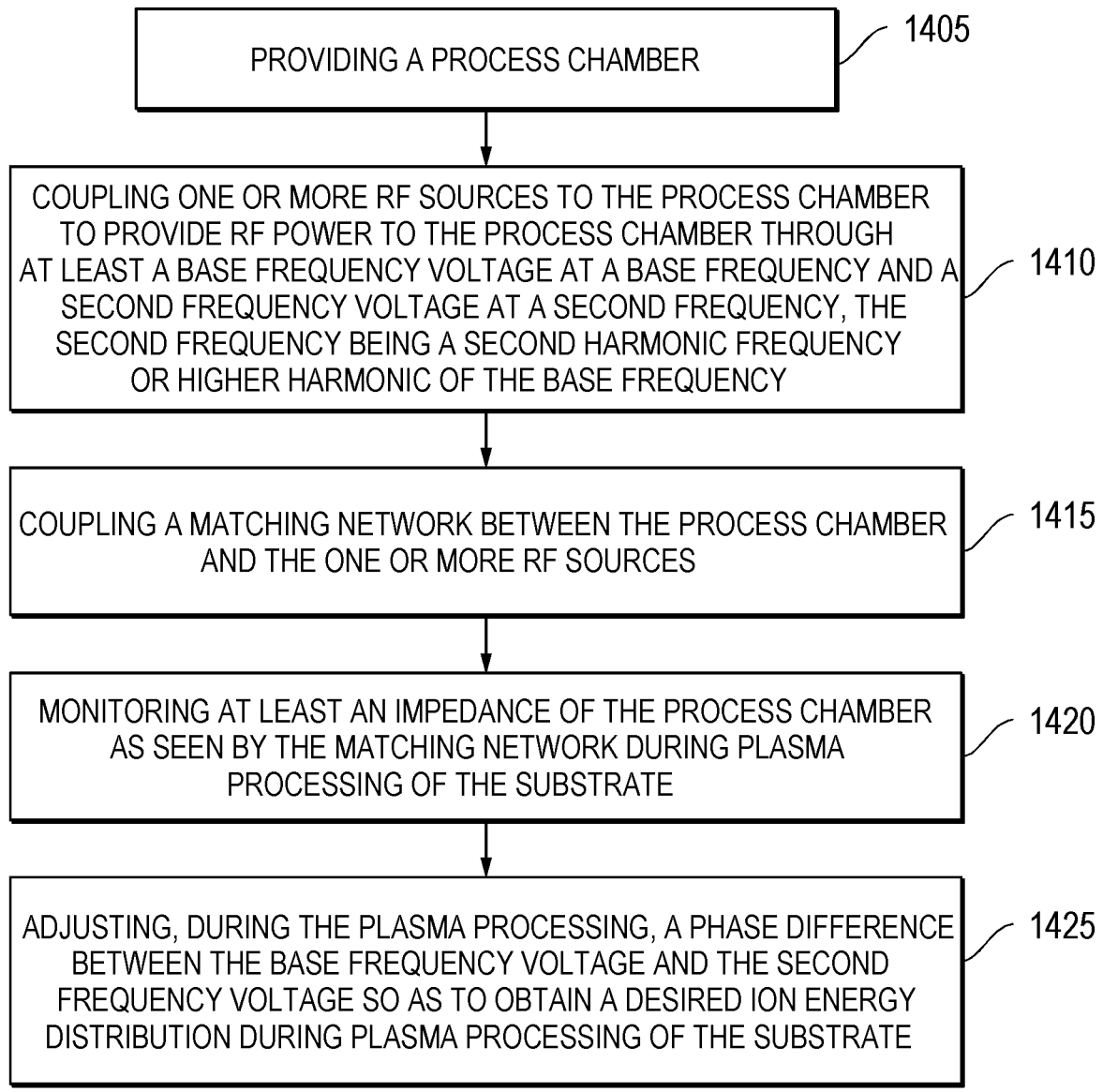

As shown in FIG. 14, a method for plasma processing a substrate is provided. Step 1405 includes providing a process chamber. Step 1410 includes coupling one or more RF sources to the process chamber to provide RF power to the process chamber through at least a base frequency voltage at a base frequency and a second frequency voltage at a second frequency, the second frequency being a second harmonic frequency or higher harmonic of the base frequency. Step 1415 includes coupling a matching network between the process chamber and the one or more RF sources. Step 1420 includes monitoring at least an impedance of the process chamber from the viewpoint of the matching network during plasma processing of the substrate. Step 1425 includes adjusting, during the plasma processing, at least a phase difference between the base frequency voltage and the second frequency voltage so as to obtain a desired ion energy distribution during plasma processing of the substrate.

Figure 15:
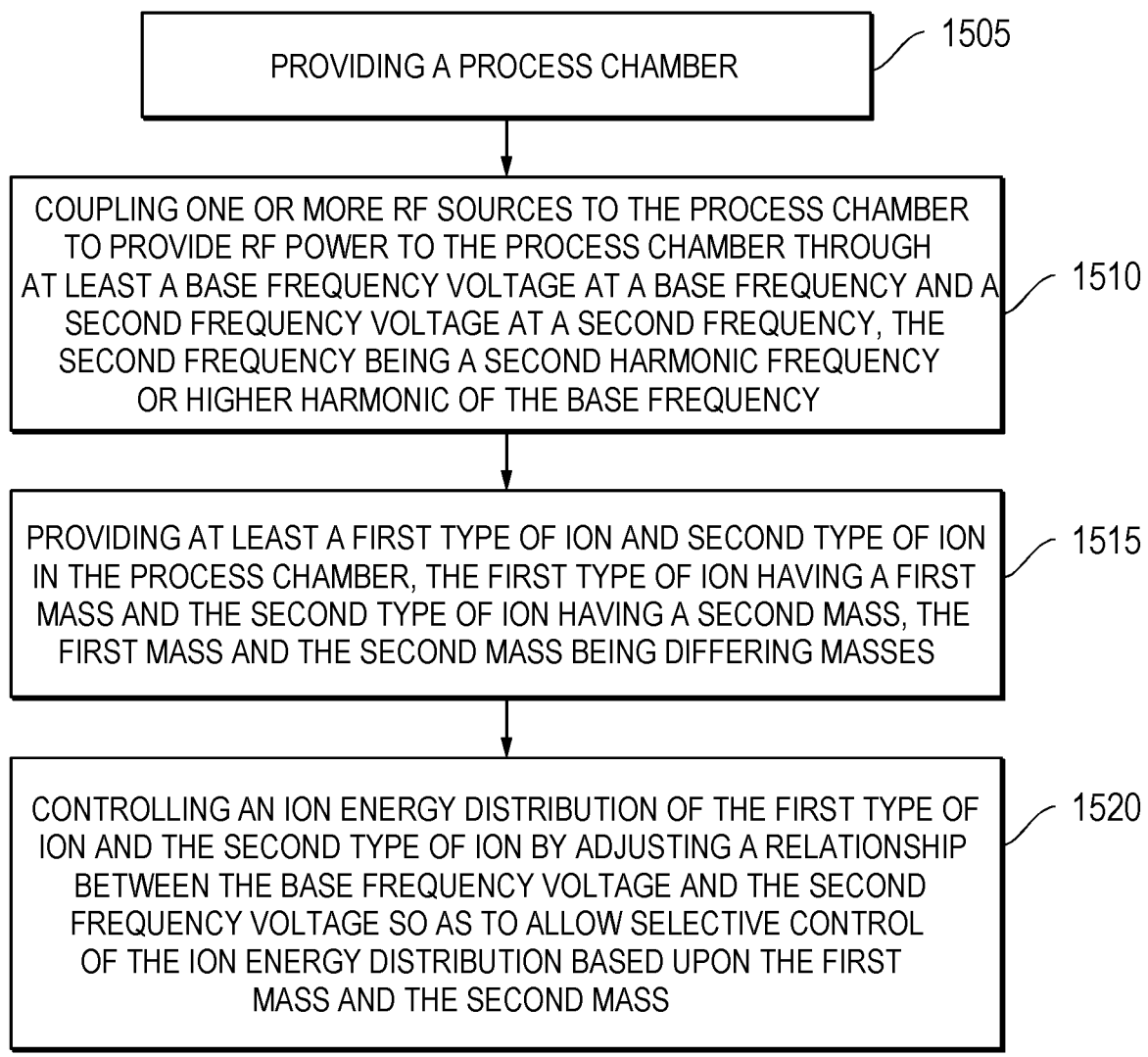

As shown in FIG. 15, a method for plasma processing a substrate is provided. Step 1505 includes providing a process chamber. Step 1510 includes coupling one or more RF sources to the process chamber to provide RF power to the process chamber through at least a base frequency voltage at a base frequency and a second frequency voltage at a second frequency, the second frequency being a second harmonic frequency or higher harmonic of the base frequency. Step 1515 includes providing at least a first type of ion and a second type of ion in the process chamber, the first type of ion having a first mass and the second type of ion having a second mass, the first mass and the second mass being differing masses. Step 1520 includes controlling an ion energy distribution of the first type of ion and the second type of ion by adjusting a relationship between the base frequency voltage and the second frequency voltage so as to allow selective control of the ion energy distribution based upon the first mass and the second mass.

Figure 16:
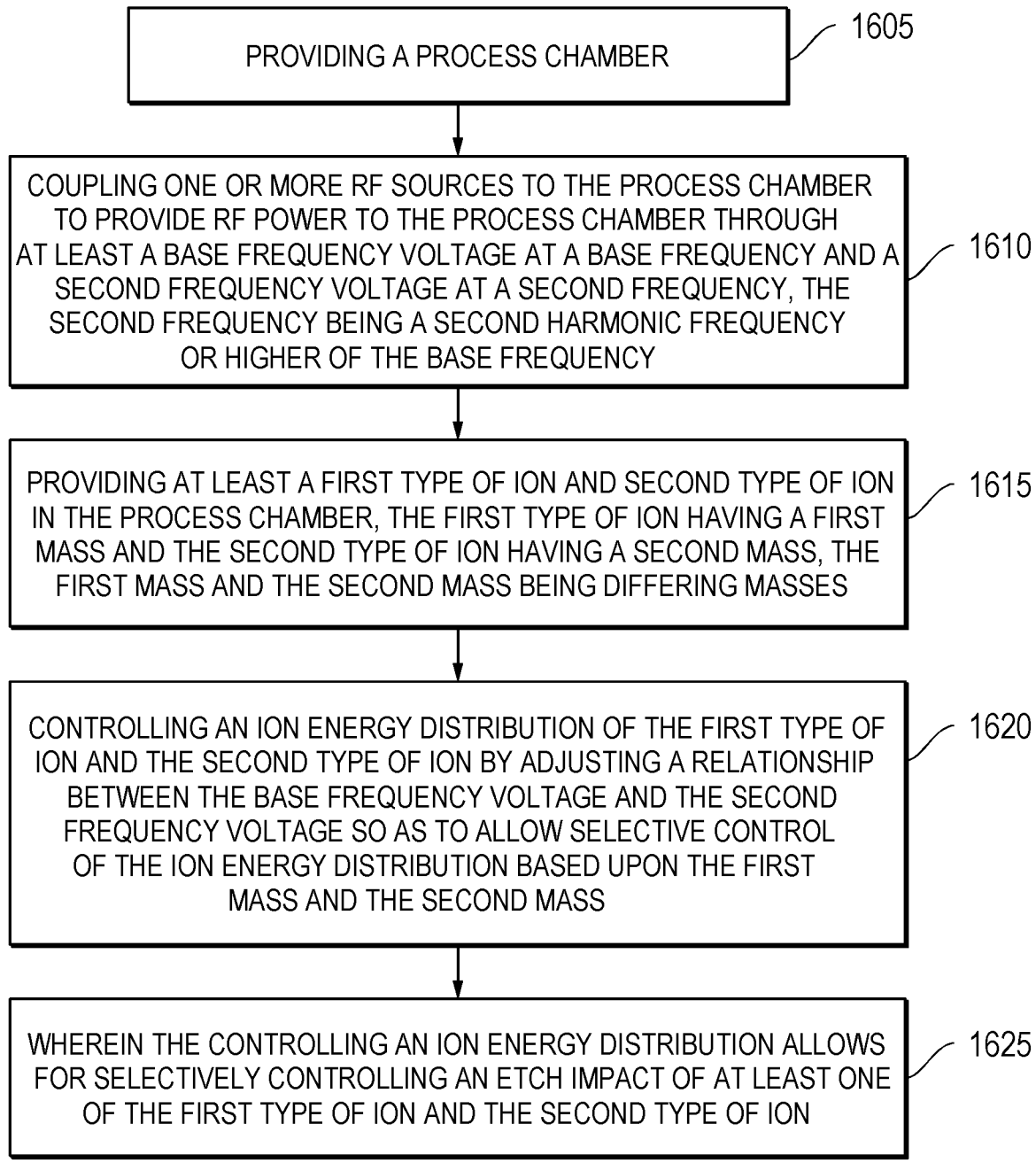

As shown in FIG. 16, a method for plasma etching a substrate is provided. Step 1605 includes providing a process chamber. Step 1610 includes coupling one or more RF sources to the process chamber to provide RF power to the process chamber through at least a base frequency voltage at a base frequency and a second frequency voltage at a second frequency, the second frequency being a second harmonic frequency or higher of the base frequency. Step 1615 includes providing at least a first type of ion and a second type of ion in the process chamber, the first type of ion having a first mass and the second type of ion having a second mass, the first mass and the second mass being differing masses. Step 1620 includes controlling an ion energy distribution of the first type of ion and the second type of ion by adjusting a relationship between the base frequency voltage and the second frequency voltage so as to allow selective control of the ion energy distribution based upon the first mass and the second mass. As indicated at step 1620, the controlling an ion energy distribution allows for selectively controlling an etch impact of at least one of the first type of ion and the second type of ion.

Figure 17:
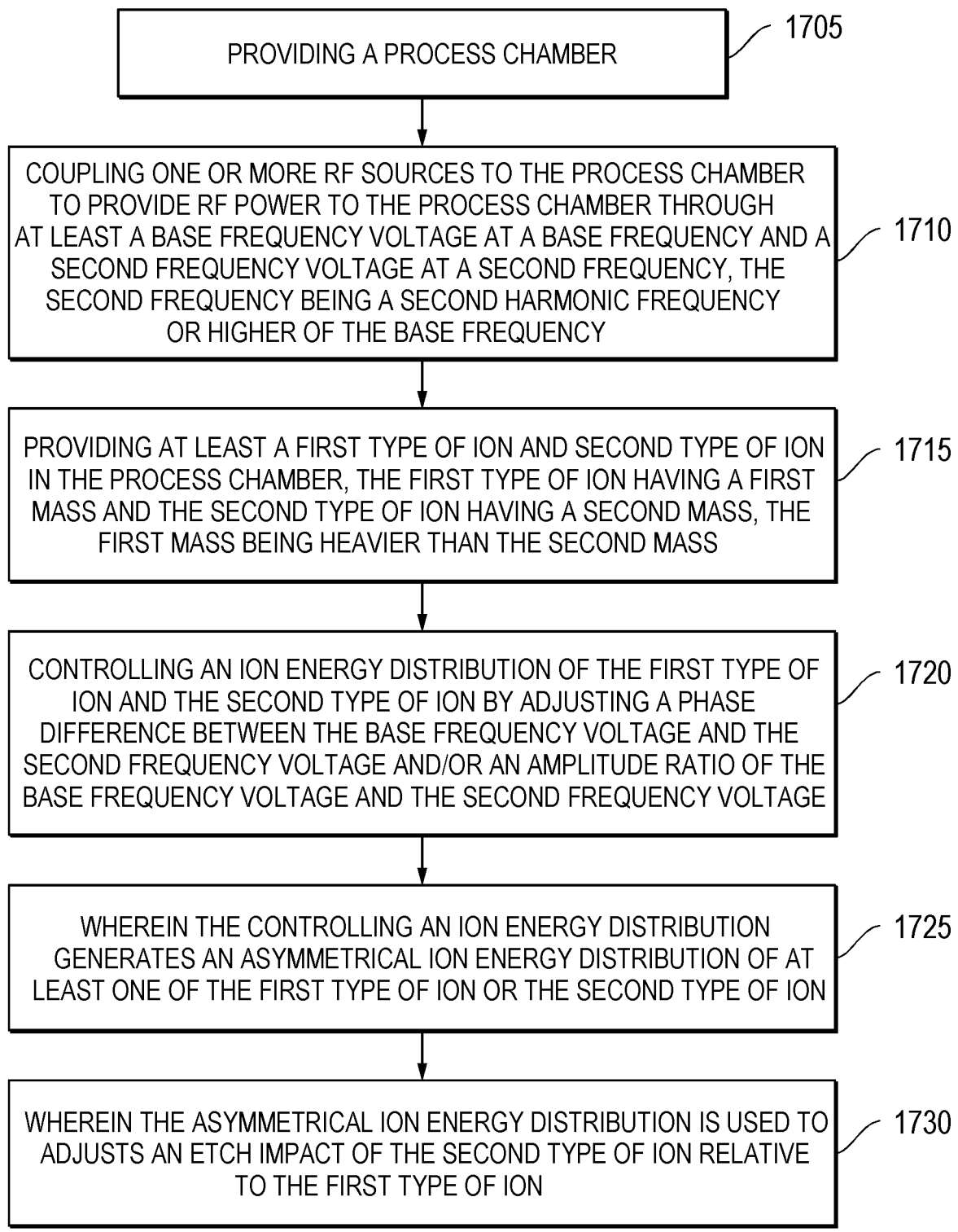

As shown in FIG. 17, a method for plasma processing a substrate is provided. Step 1705 includes providing a process chamber. Step 1710 includes coupling one or more RF sources to the process chamber to provide RF power to the process chamber through at least a base frequency voltage at a base frequency and a second frequency voltage at a second frequency, the second frequency being a second harmonic frequency or higher of the base frequency. Step 1715 includes providing at least a first type of ion and a second type of ion in the process chamber, the first type of ion having a first mass and the second type of ion having a second mass, the first mass being heavier than the second mass. Step 1720 includes controlling an ion energy distribution of the first type of ion and the second type of ion by adjusting a phase difference between the base frequency voltage and the second frequency voltage and/or an amplitude ratio of the base frequency voltage and the second frequency voltage. As indicated at step 1725, the controlling the ion energy distribution generates an asymmetrical ion energy distribution of at least one of the first type of ion or the second type of ion. As indicated at step 1730, the asymmetrical ion energy distribution is used to adjusts an etch impact of the second type of ion relative to the first type of ion.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:

1. A method for plasma processing a substrate, comprising:
    providing a process chamber;
    coupling one or more RF sources to the process chamber to provide RF power to the process chamber through at least a base frequency voltage at a base frequency and a second frequency voltage at a second frequency, the second frequency being a second harmonic frequency or higher harmonic of the base frequency;
    providing at least a first type of ion and a second type of ion in the process chamber, the first type of ion having a first mass and the second type of ion having a second mass, the first mass and the second mass being differing masses; and
    controlling an ion energy distribution of the first type of ion or the second type of ion by adjusting a relationship between the base frequency voltage and the second frequency voltage so as to allow selective control of the ion energy distribution based upon the first mass and the second mass, the ion energy distribution having at least two peaks for the second type of ion, a first peak at lower energies than at least one peak for the first type of ion and a second peak at higher energies than the at least one peak for the first type of ion, the controlling the ion energy distribution is used to enhance the second peak of the second type of ion.

2. The method of claim 1, the adjusting comprising adjusting a phase difference between the base frequency voltage and the second frequency voltage and/or an amplitude ratio of the base frequency voltage and the second frequency voltage.

3. The method of claim 2, the adjusting comprising adjusting a phase difference between the base frequency voltage and the second frequency voltage.

4. The method of claim 2, the plasma processing being a plasma etching process, wherein the controlling the ion energy distribution provides selective control of an etch impact of the first type of ion or the second type of ion based upon the first mass and the second mass being different.

5. The method of claim 4, wherein the plasma etching process is an atomic layer etch process, and the controlling the ion energy distribution selectively controls a layer modification step or a layer etch step of the atomic layer etch process.

6. A method for plasma etching a substrate, comprising:
    providing a process chamber;
    coupling one or more RF sources to the process chamber to provide RF power to the process chamber through at least a base frequency voltage at a base frequency and a second frequency voltage at a second frequency, the second frequency being a second harmonic frequency or higher of the base frequency;
    providing at least a first type of ion and a second type of ion in the process chamber, the first type of ion having a first mass and the second type of ion having a second mass, the first mass and the second mass being differing masses; and
    controlling an ion energy distribution of the first type of ion or the second type of ion by adjusting a relationship between the base frequency voltage and the second frequency voltage so as to allow selective control of the ion energy distribution based upon the first mass and the second mass, wherein the ion energy distribution having at least two peaks for the second type of ion, a first peak at lower energies than at least one peak for the first type of ion and a second peak at higher energies than the at least one peak for the first type of ion, the controlling the ion energy distribution is used to enhance the second peak of the second type of ion,
    wherein the controlling the ion energy distribution allows for selectively controlling an etch impact of at least one of the first type of ion and the second type of ion.

7. The method of claim 6, wherein the first type of ion is heavier than the second type of ion and the controlling the ion energy distribution provides for dominant etching by the second type of ion.

8. The method of claim 6, wherein the first type of ion is heavier than the second type of ion and the controlling the ion energy distribution provides for dominant etching by the first type of ion.

9. The method of claim 6, wherein the controlling occurs during plasma processing so that the ion energy distribution may change within a common gas phase of the plasma etching.

10. The method of claim 6, wherein the plasma etching is an atomic layer etch process.

11. The method of claim 10, wherein the controlling occurs during plasma processing so that the ion energy distribution may change within a common gas phase of the plasma etching.

12. The method of claim 10, wherein the controlling the ion energy distribution is utilized to place the atomic layer etch process in a layer modification step.

13. The method of claim 12, wherein the controlling occurs during plasma processing so that the ion energy distribution changes within a common gas phase of the plasma etching.

14. The method of claim 10, wherein the controlling the ion energy distribution is utilized to place the atomic layer etch process in a layer etch step.

15. The method of claim 14, wherein the controlling occurs during plasma processing so that the ion energy distribution changes within a common gas phase of the plasma etching.

16. A method for plasma etching a substrate, comprising:
    providing a process chamber;
    coupling one or more RF sources to the process chamber to provide RF power to the process chamber through at least a base frequency voltage at a base frequency and a second frequency voltage at a second frequency, the second frequency being a second harmonic frequency or higher of the base frequency;

providing at least a first type of ion and a second type of ion in the process chamber, the first type of ion having a first mass and the second type of ion having a second mass, the first mass being heavier than the second mass; and controlling an ion energy distribution of the first type of ion and the second type of ion by adjusting a phase difference between the base frequency voltage and the second frequency voltage and/or an amplitude ratio of the base frequency voltage and the second frequency voltage, the ion energy distribution having at least two peaks for the second type of ion, a first peak at lower energies than at least one peak for the first type of ion and a second peak at higher energies than the at least one peak for the first type of ion, the controlling the ion energy distribution is used to enhance the second peak of the second type of ion, wherein the controlling the ion energy distribution generates an asymmetrical ion energy distribution of at least one of the first type of ion or the second type of ion, and wherein the asymmetrical ion energy distribution is used to adjusts an etch impact of the second type of ion relative to the first type of ion.

17. The method of 16, wherein the plasma etching is atomic layer etching process and the controlling the ion energy distribution is utilized to switch the atomic layer etching process between a layer etch step and a layer modification step.

18. The method of claim 17, wherein the controlling the ion energy distribution is performed within a same gas phase of the atomic layer etching process.

* * * * *